United States Patent
Maeda et al.

(10) Patent No.: US 11,114,322 B2
(45) Date of Patent: *Sep. 7, 2021

(54) MOLD AND TRANSFER MOLDING APPARATUS

(71) Applicant: Toshiba Memory Corporation, Minato-ku (JP)

(72) Inventors: Takeori Maeda, Mie (JP); Ryoji Matsushima, Yokkaichi (JP); Makoto Kawaguchi, Chikuma (JP); Masaaki Wakui, Chikuma (JP)

(73) Assignee: Toshiba Memory Corporation, Minato-ku (JP)

( * ) Notice: Subject to any disclaimer, the term of this patent is extended or adjusted under 35 U.S.C. 154(b) by 713 days.

This patent is subject to a terminal disclaimer.

(21) Appl. No.: 15/455,475

(22) Filed: Mar. 10, 2017

(65) Prior Publication Data

US 2017/0271186 A1 Sep. 21, 2017

(30) Foreign Application Priority Data

Mar. 16, 2016 (JP) .............................. JP2016-052652

(51) Int. Cl.
*H01L 21/67* (2006.01)
*B29C 45/03* (2006.01)
(Continued)

(52) U.S. Cl.
CPC ........ *H01L 21/67259* (2013.01); *B29C 45/02* (2013.01); *B29C 45/03* (2013.01);
(Continued)

(58) Field of Classification Search
CPC ............ B29C 31/085; B29C 45/14647; B29C 45/14639
(Continued)

(56) References Cited

U.S. PATENT DOCUMENTS 3,807,914 A * 4/1974 Paulson .................. B29C 45/77
425/144
4,359,435 A * 11/1982 Kogure ............... B29C 33/3857
264/17

(Continued)

FOREIGN PATENT DOCUMENTS

JP 5-237864 9/1993
JP 6-5644 1/1994
(Continued)

*Primary Examiner* — Francisco W Tschen
*Assistant Examiner* — Guy F Mongelli
(74) *Attorney, Agent, or Firm* — Oblon, McClelland, Maier & Neustadt, L.L.P.

(57) ABSTRACT

According to one embodiment, a mold includes a substrate clamping surface, a cavity, a suction part, a vent, an intermediate cavity, and an opening/closing part. The substrate clamping surface contacts a surface of a processing substrate. The cavity is recessed from the substrate clamping surface. The suction part is recessed from the substrate clamping surface. The vent is provided on a path between the cavity and the suction part, communicates with the cavity, is recessed from the substrate clamping surface to a vent depth. The intermediate cavity is provided between the vent and the suction part on the path, communicates with the vent, and is recessed from the substrate clamping surface to an intermediate cavity depth deeper than the vent depth. The opening/closing part opens and closes the path and is provided between the intermediate cavity and the suction part on the path.

7 Claims, 9 Drawing Sheets

(51) Int. Cl.
  *B29C 45/02* (2006.01)
  *B29C 45/14* (2006.01)
  *B29C 45/77* (2006.01)
  *B29C 45/78* (2006.01)
  *B29C 45/80* (2006.01)
  *B29C 45/34* (2006.01)
  *H01L 21/687* (2006.01)
  *B29L 31/34* (2006.01)

(52) U.S. Cl.
  CPC .. *B29C 45/14065* (2013.01); *B29C 45/14336* (2013.01); *B29C 45/34* (2013.01); *B29C 45/77* (2013.01); *B29C 45/78* (2013.01); *B29C 45/80* (2013.01); *H01L 21/67248* (2013.01); *H01L 21/68721* (2013.01); *B29C 2045/14155* (2013.01); *B29C 2945/7604* (2013.01); *B29C 2945/76006* (2013.01); *B29C 2945/7618* (2013.01); *B29C 2945/76083* (2013.01); *B29C 2945/76254* (2013.01); *B29C 2945/76287* (2013.01); *B29C 2945/76568* (2013.01); *B29L 2031/34* (2013.01)

(58) Field of Classification Search
  USPC .......................... 264/272.11, 272.15, 272.17
  See application file for complete search history.

(56) References Cited

U.S. PATENT DOCUMENTS

| | | | | |
|---|---|---|---|---|
| 5,079,190 A * | 1/1992 | Mihara | .................. | H01L 24/49 438/26 |
| 5,246,643 A * | 9/1993 | Inaba | .................... | B29C 45/768 264/328.1 |
| 5,397,230 A * | 3/1995 | Brew | .................. | B29C 45/1753 264/102 |
| 5,566,743 A * | 10/1996 | Guergov | ................ | B22D 17/10 164/113 |
| 5,639,403 A * | 6/1997 | Ida | .................... | B29C 45/14065 264/255 |
| 5,766,526 A * | 6/1998 | Watanabe | ........... | B29C 45/2806 264/328.1 |
| 6,019,918 A * | 2/2000 | Guergov | ................ | B29C 33/10 264/40.1 |
| 6,030,573 A * | 2/2000 | Matsumoto | ......... | B29C 45/0025 264/511 |
| 6,048,483 A * | 4/2000 | Miyajima | ......... | B29C 45/14655 264/272.14 |
| 6,228,309 B1 * | 5/2001 | Jones | .................. | B29C 45/2806 264/328.8 |
| 6,247,577 B1 * | 6/2001 | Dahlgrun | ............. | B65G 47/248 198/417 |
| 7,371,606 B2 * | 5/2008 | Ujiie | ...................... | H01L 21/561 257/667 |
| 2002/0110658 A1 * | 8/2002 | Lucke | ...................... | B32B 1/02 428/35.7 |
| 2004/0258787 A1 * | 12/2004 | Olaru | .................. | B29C 45/1774 425/143 |
| 2006/0042773 A1 * | 3/2006 | Eisen | ...................... | B22D 17/14 164/319 |
| 2006/0124666 A1 * | 6/2006 | Takahashi | ......... | H01L 21/67173 222/135 |
| 2006/0237952 A1 * | 10/2006 | Cvengros | ........... | B60R 21/2165 280/728.3 |
| 2006/0246167 A1 * | 11/2006 | Buja | ...................... | B29C 45/77 425/144 |
| 2009/0046183 A1 * | 2/2009 | Nishida | ............. | H01L 27/14618 348/294 |
| 2010/0046771 A1 * | 2/2010 | Gregg | .................. | H04M 1/035 381/98 |
| 2010/0252713 A1 * | 10/2010 | Saito | ...................... | B29C 45/34 249/141 |
| 2011/0094474 A1 * | 4/2011 | Ikeda | .................... | F02D 9/1065 123/403 |
| 2013/0328236 A1 * | 12/2013 | Yamamoto | .......... | B29C 45/0046 264/257 |
| 2015/0235871 A1 | 8/2015 | Akiba et al. | | |
| 2016/0279852 A1 * | 9/2016 | Fitzpatrick | ............. | B29C 45/47 |
| 2016/0279854 A1 * | 9/2016 | Fitzpatrick | ............. | B29C 45/74 |
| 2017/0050345 A1 | 2/2017 | Nakazawa et al. | | |
| 2018/0254198 A1 * | 9/2018 | Maeda | .................. | H01L 21/565 |
| 2019/0103429 A1 * | 4/2019 | Hsu | .................. | H01L 27/14636 |

FOREIGN PATENT DOCUMENTS

| | | |
|---|---|---|
| JP | 11-058454 | 3/1999 |
| JP | 2008-117998 A | 5/2008 |
| JP | 2014-172287 | 9/2014 |
| JP | 2014-172287 A | 9/2014 |
| JP | 2015-520 A | 1/2015 |
| TW | 201446458 A | 12/2014 |
| TW | 201533831 A | 9/2015 |
| TW | 201600297 A | 1/2016 |

* cited by examiner

MOLD AND TRANSFER MOLDING APPARATUS

CROSS-REFERENCE TO RELATED APPLICATIONS

This application is based upon and claims the benefit of priority from Japanese Patent Application No. 2016-052652, filed on Mar. 16, 2016; the entire contents of which are incorporated herein by reference.

FIELD

Embodiments described herein relate generally to a mold and a transfer molding apparatus.

BACKGROUND

For example, there is a semiconductor device or the like in which multiple stacked semiconductor elements are sealed with a resin, etc. For example, such a semiconductor device is manufactured by a transfer molding apparatus using molds. For example, molding defects occur if the resin is not filled appropriately. A mold and a transfer molding apparatus that have good moldability are desirable.

DETAILED DESCRIPTION

Figure 1:
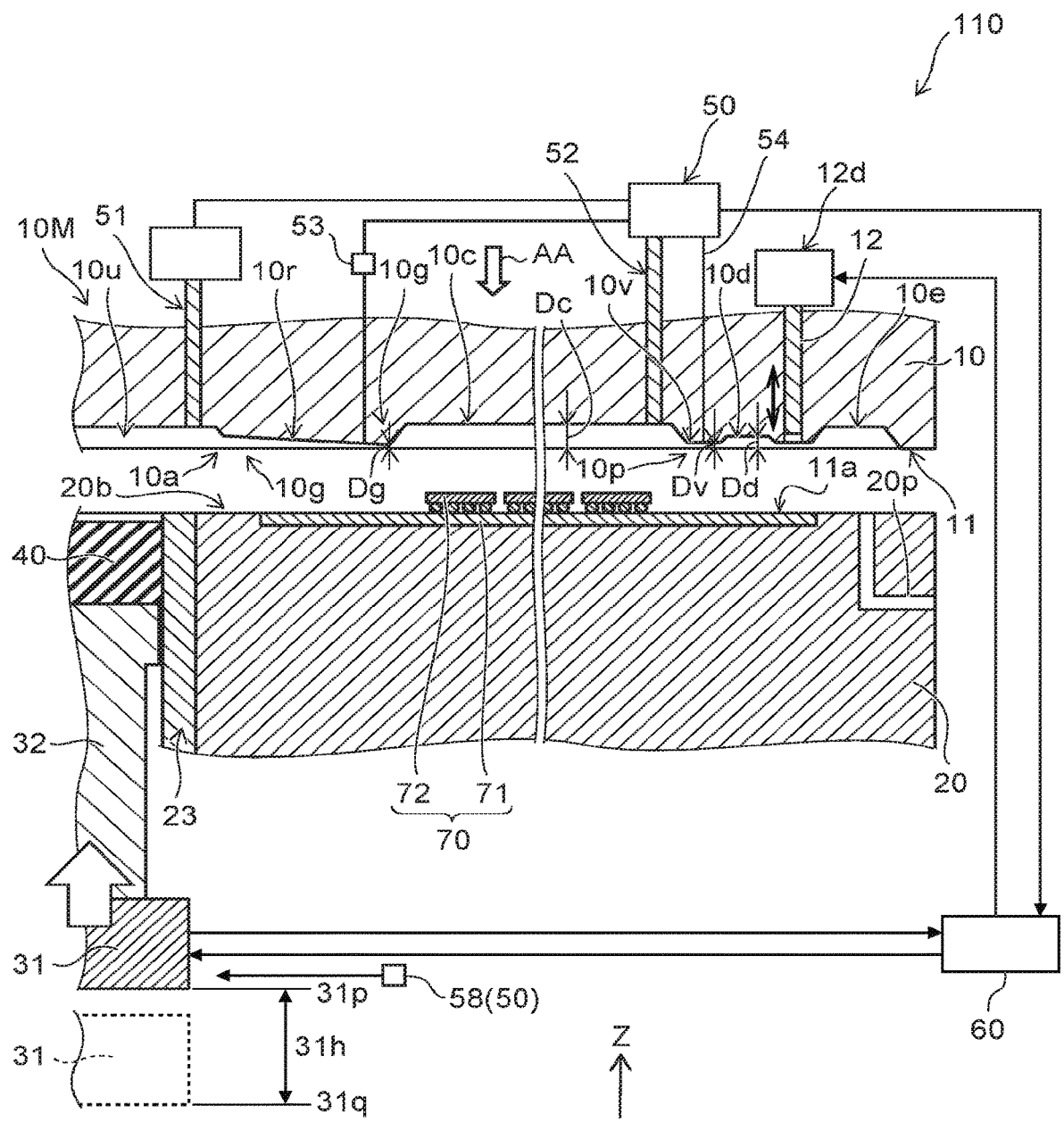
FIG. 1 is a schematic cross-sectional view illustrating a mold and a transfer molding apparatus according to an embodiment.

According to one embodiment, a mold includes a substrate clamping surface, a cavity, a suction part, a vent, an intermediate cavity, and an opening/closing part. The substrate clamping surface contacts a surface of a processing substrate. The cavity is recessed from the substrate clamping surface. The suction part is recessed from the substrate clamping surface. The vent is provided on a path between the cavity and the suction part, communicates with the cavity, is recessed from the substrate clamping surface to a vent depth, and is used as an exhaust path of a gas inside the cavity. The intermediate cavity is provided between the vent and the suction part on the path, communicates with the vent, and is recessed from the substrate clamping surface to an intermediate cavity depth deeper than the vent depth. The opening/closing part opens and closes the path and is provided between the intermediate cavity and the suction part on the path.

According to one embodiment, a transfer molding apparatus includes the mold, a transfer part introducing a resin to the mold, and a sensor. The transfer part fills the resin into the cavity in an open state of the opening/closing part. The sensor senses that at least a portion of the resin has passed through the vent and reached at least a portion of the intermediate cavity. The opening/closing part is set to a closed state after the sensing by the sensor.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

FIG. 1 is a schematic cross-sectional view illustrating a mold and a transfer molding apparatus according to an embodiment.

Figure 2A:
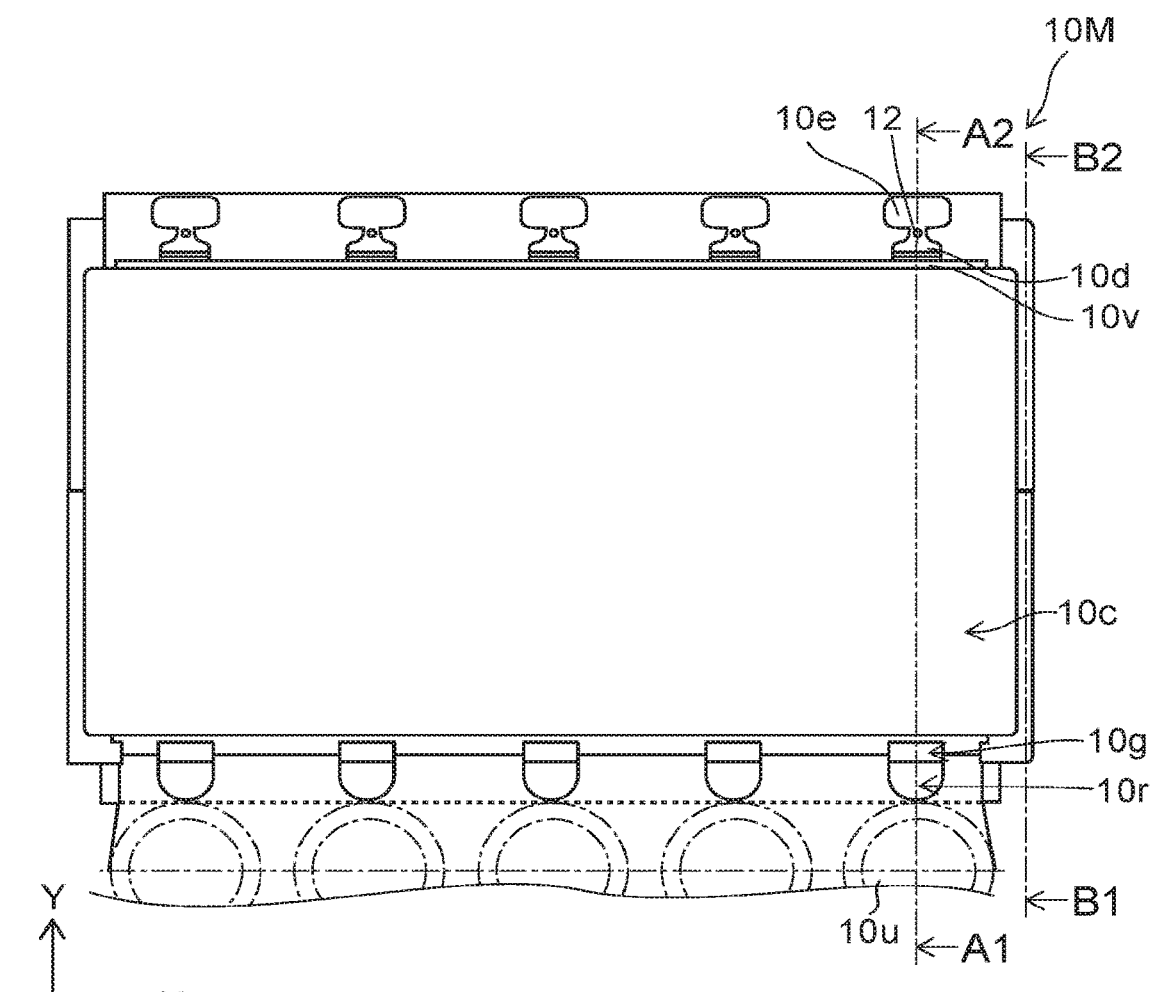
FIG. 2A and FIG. 2B are schematic views illustrating the mold according to the embodiment.
Figure 2B:
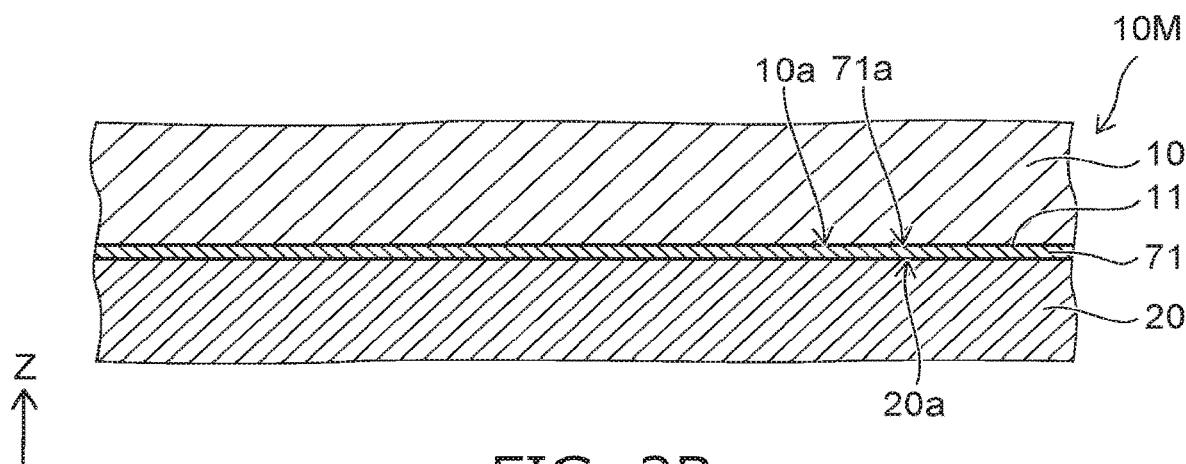

FIG. 2A and FIG. 2B are schematic views illustrating the mold according to the embodiment.

FIG. 1 corresponds to a line A1-A2 cross section of FIG. 2A. FIG. 2A is a plan view as viewed along arrow AA of FIG. 1. FIG. 2B is a cross-sectional view corresponding to a line B1-B2 cross section of FIG. 2A.

As shown in FIG. 1, the mold 10M according to the embodiment includes a first mold 10 and a second mold 20. A major surface 10a of the first mold 10 is disposed to oppose a major surface 20b of the second mold 20. FIG. 1 shows an example of a state in which the two molds are separated from each other.

In the example, a processing substrate 71 of a processing object 70 is disposed on the major surface 20a of the second mold 20. For example, a semiconductor chip 72 is provided on the processing substrate 71. The processing substrate 71 and the semiconductor chip 72 are a portion of the semiconductor device to be manufactured.

In the embodiment, the processing substrate 71 may be disposed on the first mold 10; and the second mold 20 may be disposed on the processing substrate 71. In the embodiment, the processing substrate 71 may be disposed on the second mold 20; and the first mold 10 may be provided on the processing substrate 71.

A direction from the second mold 20 toward the first mold 10 is taken as a Z-axis direction. One direction perpendicular to the Z-axis direction is taken as an X-axis direction. A direction perpendicular to the Z-axis direction and the X-axis direction is taken as a Y-axis direction. For example, the major surfaces of the molds spread along the X-Y plane.

As shown in FIG. 2A, a gate-side mold clamping part and a gate-side substrate clamping part are provided in the mold 10M. A vent-side mold clamping part and a vent-side substrate clamping part are provided in the mold 10M. The processing substrate 71 is disposed between the two molds; and, for example, the surfaces of the substrate clamping parts contact the processing substrate 71 in the state in which the two molds are closed.

FIG. 2B shows the state in which the two molds are closed.

As shown in FIG. 1 and FIG. 2B, the first mold 10 has a substrate clamping surface 11 (the surface of the substrate clamping part). As shown in FIG. 2B, the substrate clamping surface 11 contacts a surface 11a of the processing substrate 71 when the processing substrate 71 (the processing object 70) is disposed between the first mold 10 and the second mold 20. The processing substrate 71 is clamped by the substrate clamping surface 11 and the surface (the major surface 20a) of the second mold 20.

As shown in FIG. 1, recesses are provided in the major surface 10a of the first mold 10. A resin 40 is introduced to the recesses. The semiconductor device is made by the resin 40 being formed into a configuration corresponding to the configurations of the recesses.

In the example, a cull 10u, a runner 10r, a gate 10g, a cavity 10c, a vent 10v, an intermediate cavity 10d, and a suction part 10e are provided as the recesses in the major surface 10a of the first mold 10. These parts are regions recessed from the flat portion (the substrate clamping surface 11) of the major surface 10a of the first mold 10. These parts communicate with each other.

In the example, an opening/closing part 12 is provided in the first mold 10. The opening/closing part 12 is, for example, a shut-off pin. A driving part 12d that operates the opening/closing part 12 is provided. For example, a state in which the recesses communicate with the outside and a state in which the recesses do not communicate with the outside are formed by the operation of the opening/closing part 12 by the driving part 12d.

The suction part 10e communicates with one end of a suction path 20p. Another end of the suction path 20p communicates with a depressurizing apparatus (e.g., a not-illustrated depressurizing pump, etc.).

As described below, the processing object 70 is disposed between the two molds; the molds are caused to approach each other; and the molds are set so that portions of the two molds contact each other. For example, when the opening/closing part 12 is in the open state, the gas (e.g., air) that is inside the cavity 10c is exhausted via the vent 10v, the intermediate cavity 10d, the suction part 10e, and the suction path 20p. The suction part 10e is, for example, an air suction part. The resin 40 is introduced to the cavity 10c having the gas exhausted from the interior of the cavity 10c. In the example, the suction path 20p is provided in the second mold 20. In the embodiment, the suction path 20p may be provided in the first mold 10.

The resin 40 is introduced via a pot 23 provided in the mold 10M. In the example, the pot 23 is provided in the second mold 20. In the embodiment, the pot 23 may be provided in the first mold 10. The resin 40 is filled from the pot 23.

A transfer molding apparatus 110 according to the embodiment includes the mold 10M, a transfer part 31, and a sensor 50. A plunger 32 and a controller 60 are provided in the example. For example, the controller 60 controls the exhaust of the gas from the space inside the mold 10M via the suction part 10e and controls the introduction of the resin 40 to the space inside the mold 10M based on the operation of the transfer part 31.

At least a portion of the pot 23 has, for example, a tubular configuration. The plunger 32 is disposed in the interior of the pot 23. The resin 40 is disposed at an end part of the plunger 32. For example, the transfer part 31 is movable vertically (along the Z-axis direction). An initial position 31q is the position of the bottom part of the transfer part 31 in the initial state. The position of the bottom part of the transfer part 31 becomes a post-movement position 31p by the transfer part 31 moving in the upward direction. The difference between the post-movement position 31p and the initial position 31q is a movement height 31h. By the movement of the transfer part 31, the plunger 32 moves; and the resin 40 is supplied to the interior of the mold 10M (i.e., between the first mold 10 and the second mold 20).

For example, the resin 40 is introduced to the cull 10u when the opening/closing part 12 is in the open state. The resin 40 that passes through the cull 10u passes through the runner 10r and reaches the gate 10g. Subsequently, the resin is introduced to the cavity 10c. For example, the opening/closing part 12 is set to the closed state when the resin 40 reaches the vent 10v and the intermediate cavity 10d. The cavity 10c, the vent 10v, and the intermediate cavity 10d become a sealed space; and the resin 40 is filled into these parts at a high pressure.

Thus, the mold 10M (in the example, the first mold 10) according to the embodiment includes the substrate clamping surface 11, the cavity 10c, the suction part 10e, the vent 10v, the intermediate cavity 10d, and the opening/closing part 12. The substrate clamping surface 11 contacts the surface 71a of the processing substrate 71 (referring to FIG. 2B). The cavity 10c is recessed from the substrate clamping surface 11 (referring to FIG. 1). The suction part 10e is recessed from the substrate clamping surface 11 (referring to FIG. 1).

The vent 10v is provided on a path 10p between the cavity 10c and the suction part 10e (referring to FIG. 1 and FIG. 2A). The vent 10v communicates with the cavity 10c and is used as the exhaust path of the gas inside the cavity 10c. The cavity 10c is recessed from the substrate clamping surface 11 to a cavity depth Dc (referring to FIG. 1).

The intermediate cavity 10d is provided between the vent 10v and the suction part 10e on the path 10p. The intermediate cavity 10d communicates with the vent 10v. The intermediate cavity 10d is recessed from the substrate clamping surface 11 to an intermediate cavity depth Dd. The intermediate cavity depth Dd is deeper than a vent depth Dv (referring to FIG. 1).

The opening/closing part 12 (e.g., the shut-off pin) is provided between the intermediate cavity 10d and the suction part 10e on the path 10p. For example, the opening/closing part 12 performs at least one of a vertical operation or a rotation operation. Thereby, the opening/closing part 12 is able to open and close the communicating portion between the intermediate cavity 10d and the suction part 10e.

For example, there is a reference example in which the deep intermediate cavity 10d recited above is not provided. In the reference example, the opening/closing part 12 is set to the open state; the resin 40 is introduced to the cavity 10c of the mold 10M; the opening/closing part 12 is set to the closed state after the resin 40 passes through the vent 10v; and a high pressure is applied to the resin 40. In the case where the timing of switching the opening/closing part 12 from the open state to the closed state is inappropriate, for example, unfilled portions of the resin 40 or leaking of the resin 40 occurs. In the reference example, there are cases where the moldability is insufficient.

Conversely, the intermediate cavity 10d is provided in the embodiment. The intermediate cavity depth Dd is set to be deeper than the vent depth Dv. Thereby, for example, the velocity of the resin 40 passing through the vent 10v becomes slower in the intermediate cavity 10d. Thereby, the margin of the timing of switching the opening/closing part 12 to obtain the appropriate molding state is enlarged. For example, the unfilled portions of the resin 40 and the leaking of the resin 40 can be suppressed. According to the embodiment, a mold and a transfer molding apparatus that have good moldability can be provided.

In the embodiment, in the case where the gate 10g is provided, the gate 10g is set to be deeper than the depth of the vent 10v. In other words, the mold 10M (the first mold 10) further includes the gate 10g that is recessed from the substrate clamping surface 11 to a gate depth Dg (referring to FIG. 1). The cavity 10c is provided in at least a portion between the gate 10g and the vent 10v. The vent depth Dv is shallower than the gate depth Dg.

For example, the gate depth Dg is greater than 150 μm, e.g., 250 μm or less. On the other hand, the vent depth Dv is not less than 10 μm and not more than 150 μm. By setting the vent depth Dv to be shallower than the gate depth Dg, for example, both the effect of damming the resin 40 and the exhaust effect of the gas (the air) can be realized. Thereby, good fillability is obtained.

The transfer molding apparatus 110 according to the embodiment includes the mold 10M, the transfer part 31 that introduces the resin 40 to the mold 10M, and the sensor 50 recited above. The transfer part 31 fills the resin 40 into the cavity 10c when the opening/closing part 12 is in the open state. The sensor 50 senses that at least a portion of the resin 40 has passed through the vent 10v and reached at least a portion of the intermediate cavity 10d. The opening/closing part 12 is set to the closed state after the sensing by the sensor 50. For example, the transfer part 31 sets the pressure applied to the resin 40 in the closed state to be higher than the pressure applied to the resin 40 in the open state recited above. Thereby, high fillability is obtained.

For example, the control of these operations is performed by the controller 60.

For example, the sensing by the sensor 50 is performed by sensing, at a path 10q between the transfer part 31 and the cavity 10c, at least one of the temperature of the mold 10M, the pressure of the resin 40, reflected light at the mold 10M, or reflected light at the processing substrate 71.

For example, the sensing by the sensor 50 may be performed by sensing, at the path 10p between the cavity 10c and the suction part 10e, at least one of the temperature of the mold 10M, the pressure of the resin 40, reflected light at the mold 10M, or reflected light at the processing substrate 71.

For example, the sensing by the sensor 50 may be performed by sensing the position of the transfer part 31.

As shown in FIG. 1, a first pressure sensor 51 is provided in the example. The first pressure sensor 51 senses the pressure of the resin 40 at the path 10q. A second pressure sensor 52 is provided in the example. The second pressure sensor 52 senses the pressure of the resin 40 at the path 10p. A first temperature sensor 53 is provided in the example. The first temperature sensor 53 senses the temperature of the mold 10M at the path 10q. A second temperature sensor 54 is provided in the example. The second temperature sensor 54 senses the temperature of the mold 10M at the path 10p.

For example, the pressure of the resin 40 changes when the resin 40 passes through the various recesses provided in the mold 10M according to the depths of these recesses. The position that is reached by the end part of the resin 40 can be determined by sensing the change of the pressure of the resin 40. For example, the temperature of the mold 10M changes according to the state of the resin 40 passing through the various recesses provided in the mold 10M. The position that is reached by the end part of the resin 40 can be determined by sensing the temperature change of the mold 10M. Also, the position that is reached by the end part of the resin 40 can be determined by irradiating light and by sensing the reflected light at the mold 10M or the processing substrate 71.

A transfer position sensor 58 is provided in the example. The transfer position sensor 58 senses the position (the position along the Z-axis direction) of the transfer part 31. For example, the position of the transfer part 31 changes according to the state of the resin 40 passing through the various recesses provided in the mold 10M. The position that is reached by the end part of the resin 40 can be determined by sensing the change of the position. The transfer position sensor 58 is included in a portion of the sensor 50.

An example of the operation of the transfer molding apparatus 110 will now be described.

Figure 3:
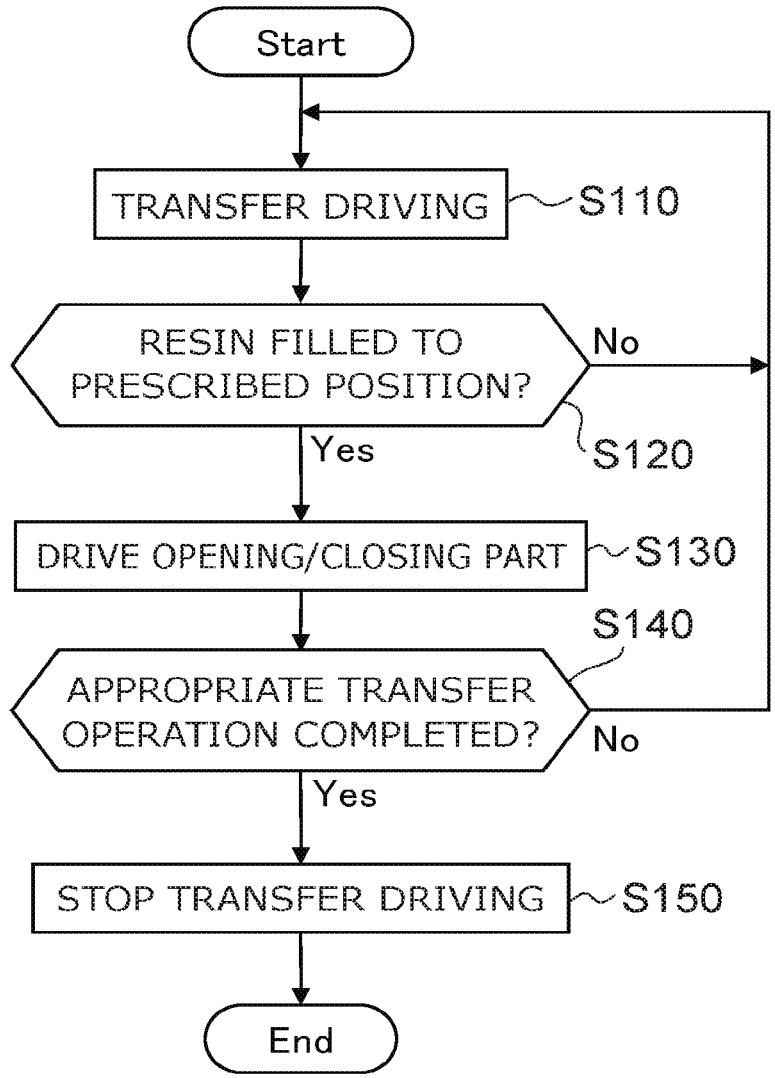
FIG. 3 is a flowchart illustrating the operation of the transfer molding apparatus according to the embodiment.

FIG. 3 is a flowchart illustrating the operation of the transfer molding apparatus according to the embodiment.

FIG. 4 to FIG. 8 are schematic cross-sectional views in order of the processes, illustrating the operation of the transfer molding apparatus according to the embodiment.

Figure 4:
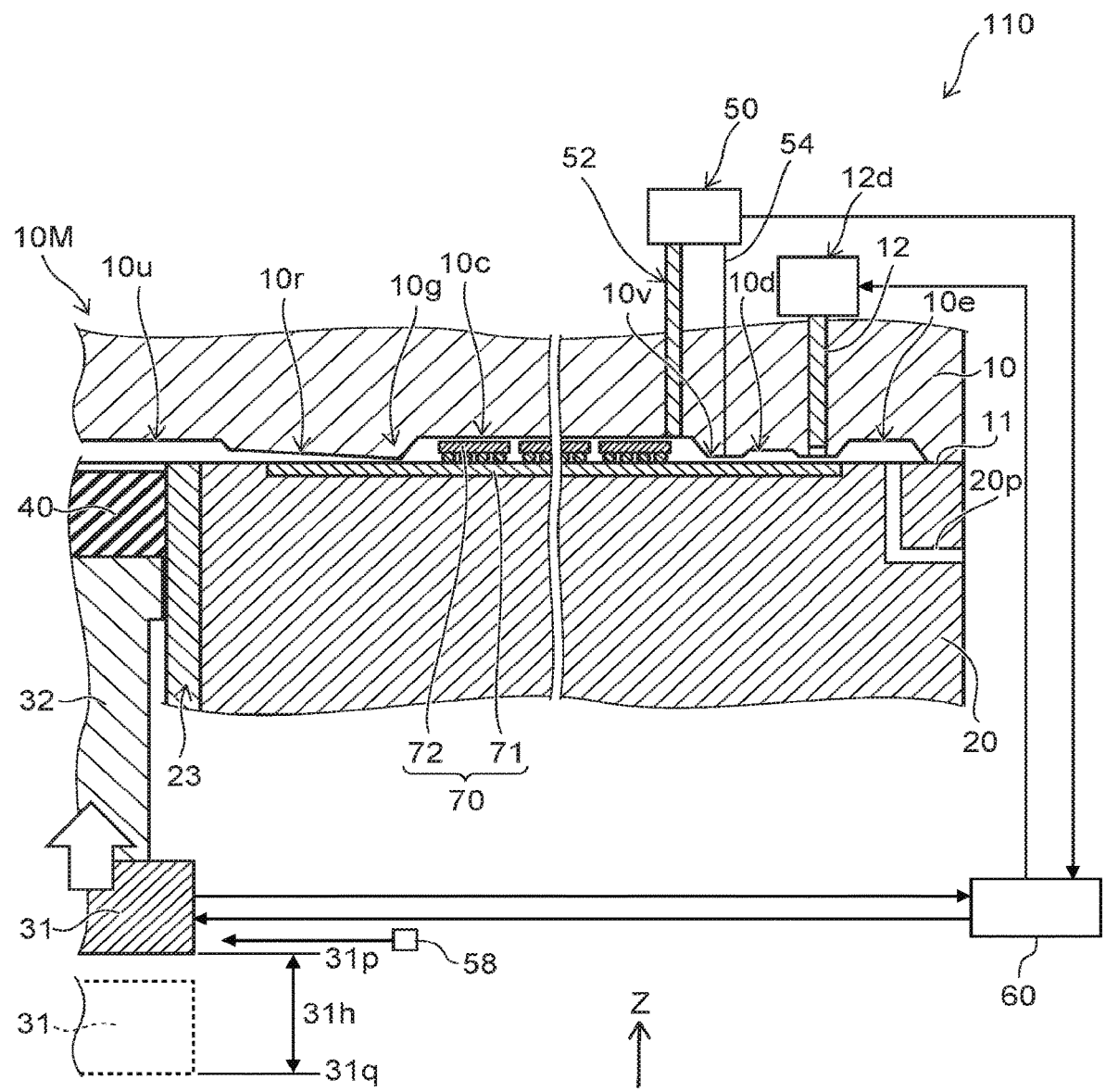
FIG. 4 is a schematic cross-sectional view in order of the processes, illustrating the operation of the transfer molding apparatus according to the embodiment.

As shown in FIG. 4, the processing object 70 is disposed between the first mold 10 and the second mold 20; and these molds are closed. Then, the space between these molds is depressurized. At this time, the opening/closing part 12 is in the open state.

Subsequently, as shown in FIG. 3, the transfer part 31 is driven (step S110).

Figure 5:
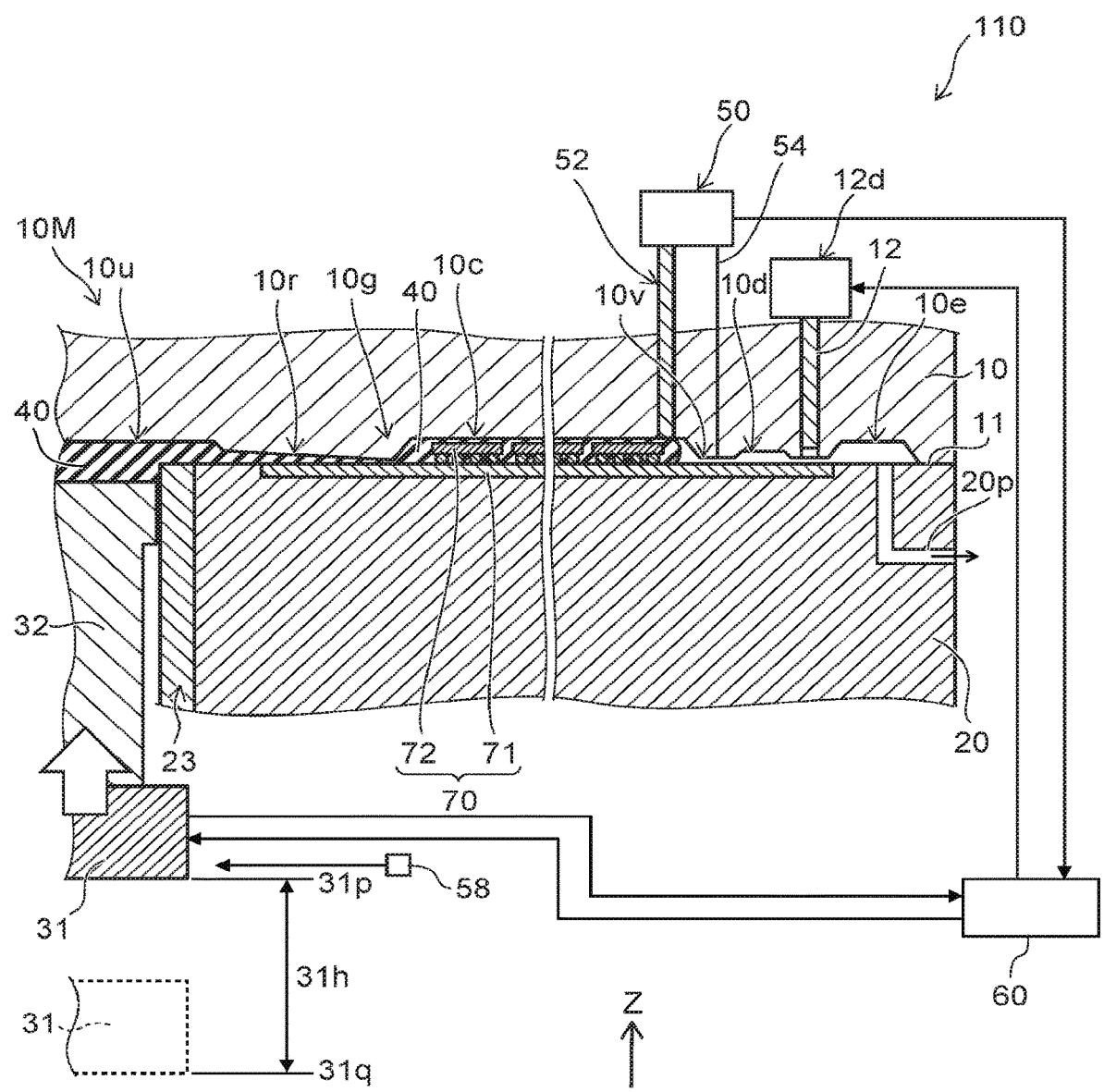
FIG. 5 is a schematic cross-sectional view in order of the processes, illustrating the operation of the transfer molding apparatus according to the embodiment.

In other words, as shown in FIG. 5, the plunger 32 is moved upward by driving the transfer part 31. Thereby, the resin 40 is supplied to the interior of the cavity 10c.

As shown in FIG. 3, it is determined whether or not the resin 40 is filled to a prescribed position (step S120). In the case of "No," the flow returns to step S110. In the case of "Yes," the flow proceeds to step S130 described below.

Figure 6:
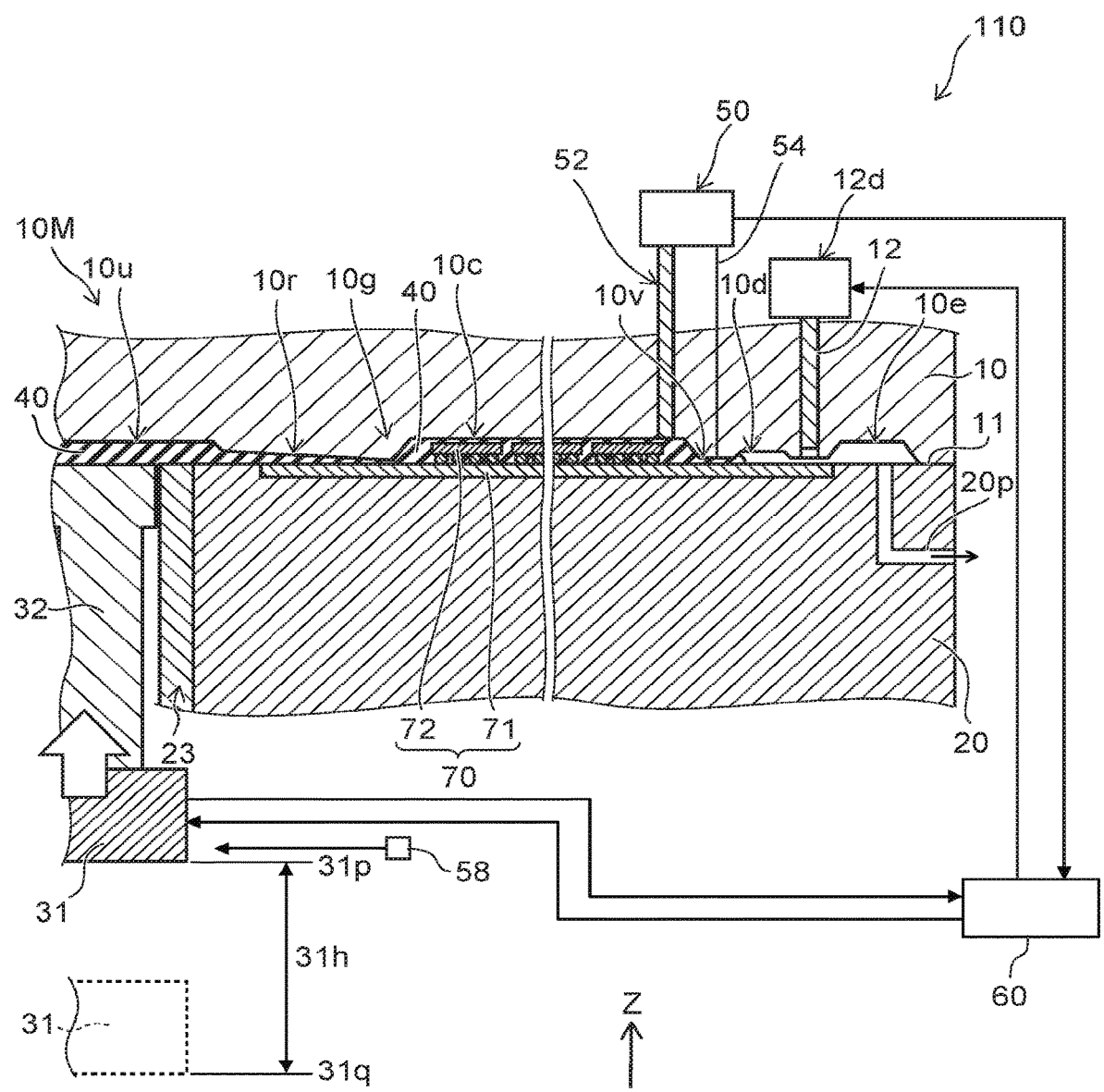
FIG. 6 is a schematic cross-sectional view in order of the processes, illustrating the operation of the transfer molding apparatus according to the embodiment.

For example, in step S120 as shown in FIG. 6, the position of the resin 40 is sensed by the sensor 50 (the second pressure sensor 52, the second temperature sensor 54, the transfer position sensor 58, etc.). For example, the overflow of the resin 40 from the cavity 10c is sensed. The state of the operation of the transfer part 31 may be modified based on the sensing result.

Figure 7:
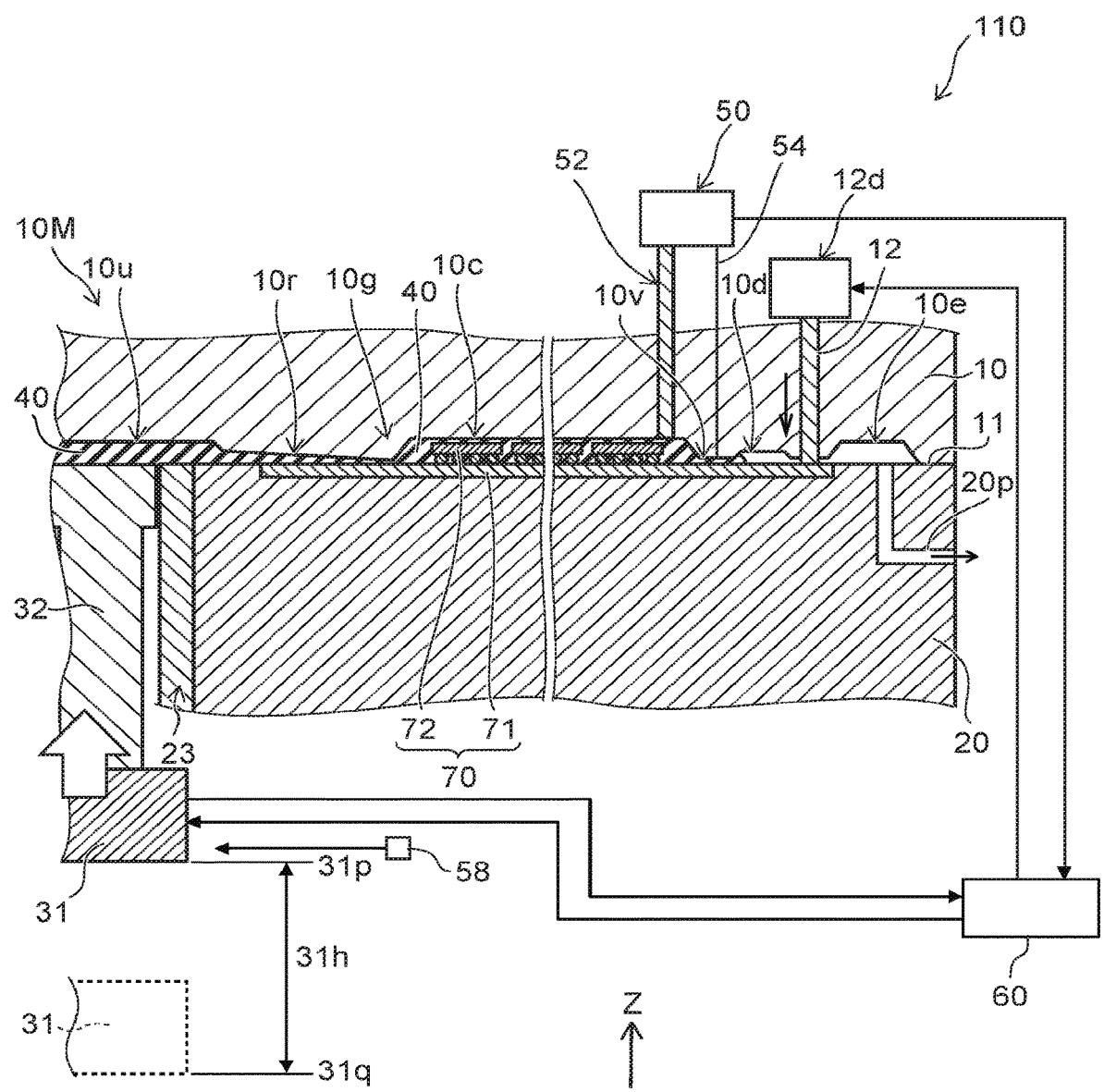
FIG. 7 is a schematic cross-sectional view in order of the processes, illustrating the operation of the transfer molding apparatus according to the embodiment.

As shown in FIG. 7, the resin 40 passes through the vent 10v; and at least a portion of the resin 40 reaches the intermediate cavity 10d. For example, at this time, it is determined that the resin 40 is filled to the prescribed position. At this time, the opening/closing part 12 (the shut-off pin) is set to the closed state. In the example, the shut-off pin moves downward and blocks the path.

Thus, the opening/closing part 12 is driven in step S130 FIG. 3. In other words, the opening/closing part 12 is set to the closed state.

Figure 8:
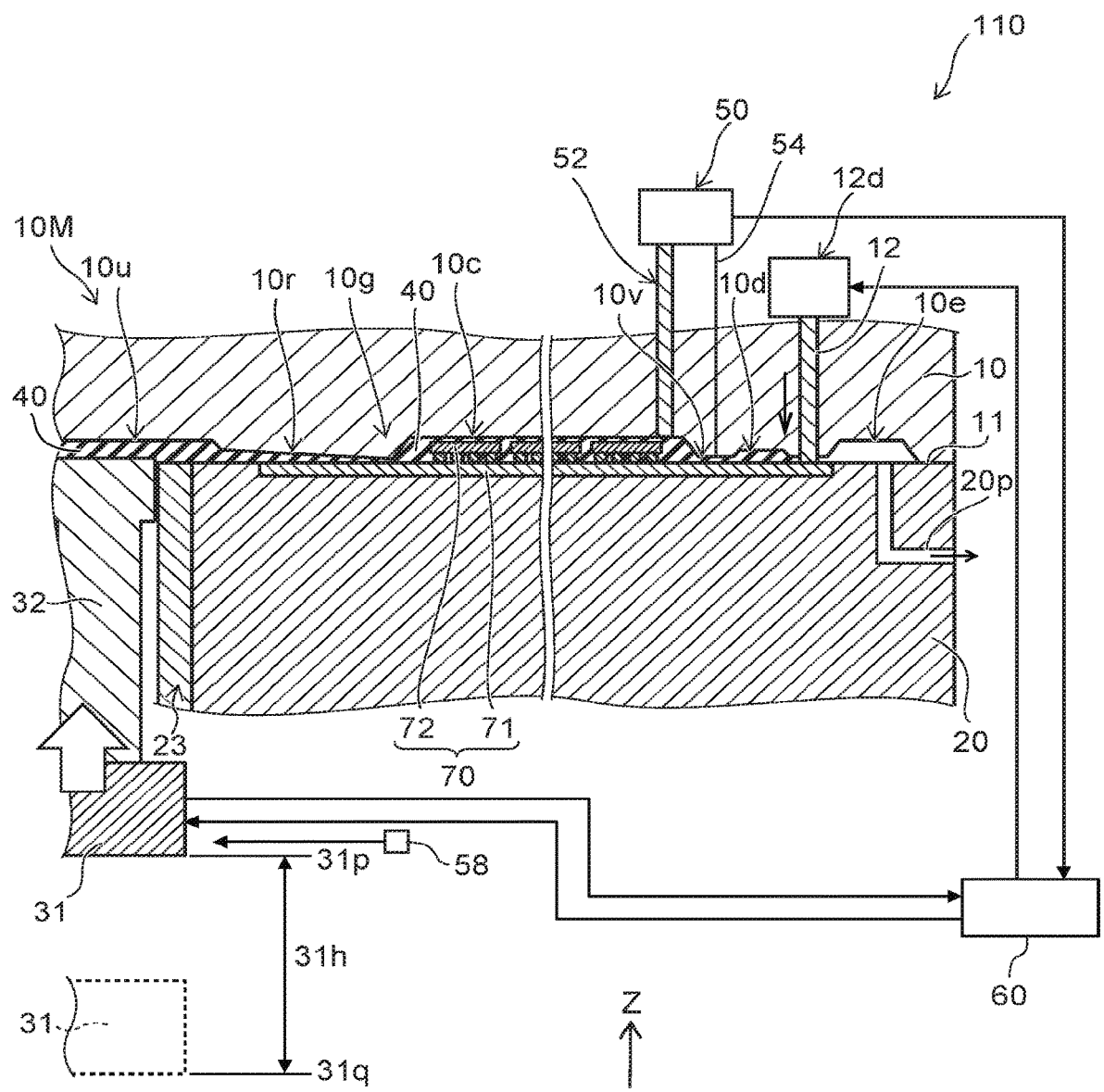
FIG. 8 is a schematic cross-sectional view in order of the processes, illustrating the operation of the transfer molding apparatus according to the embodiment.

Then, as shown in FIG. 8, the resin 40 is further supplied with the opening/closing part 12 in the closed state. The resin 40 is filled into the intermediate cavity 10d.

As shown in FIG. 3, it is determined whether or not the appropriate transfer operation is completed (step S140). In other words, for example, it is determined whether or not the resin 40 is filled into the mold 10M. Thermal curing of the resin 40 is started while applying a high filling pressure. Then, as shown in FIG. 3, the driving of the transfer part 31 is stopped (step S150).

In the embodiment, when the average particle size of the filler included in the resin is not less than 0.5 μm and not more than 3 μm, it is favorable for the vent depth Dv to be, for example, not less than 40 μm and not more than 150 μm.

When the vent depth Dv is less than 40 μm, the dam effect of the resin 40 is high; but the exhaust effect of the gas is low. When the vent depth Dv exceeds 150 μm, the exhaust effect of the gas is improved; but the dam effect of the resin 40 decreases. When the vent depth Dv is not less than 40 μm and not more than 150 μm, for example, the dam effect of the resin 40 is high; and the exhaust effect of the gas also is high.

On the other hand, in the embodiment, when the average particle size of the filler included in the resin is greater than 3 μm (e.g., not less than 5 μm and not more than 6 μm), it is favorable for the vent depth Dv to be, for example, not less than 40 μm and not more than 200 μm. When the vent depth Dv is less than 40 μm, the dam effect of the resin 40 is high; but the exhaust effect of the gas is low. When the vent depth Dv exceeds 200 μm, the exhaust effect of the gas is improved; but the dam effect of the resin 40 decreases. When the vent depth Dv is not less than 40 μm and not more than 200 μm, for example, the dam effect of the resin 40 is high; and the exhaust effect of the gas also is high.

FIG. 9A to FIG. 9F are schematic plan views illustrating the mold according to embodiments.

Figures 9A, 9B, 9C:
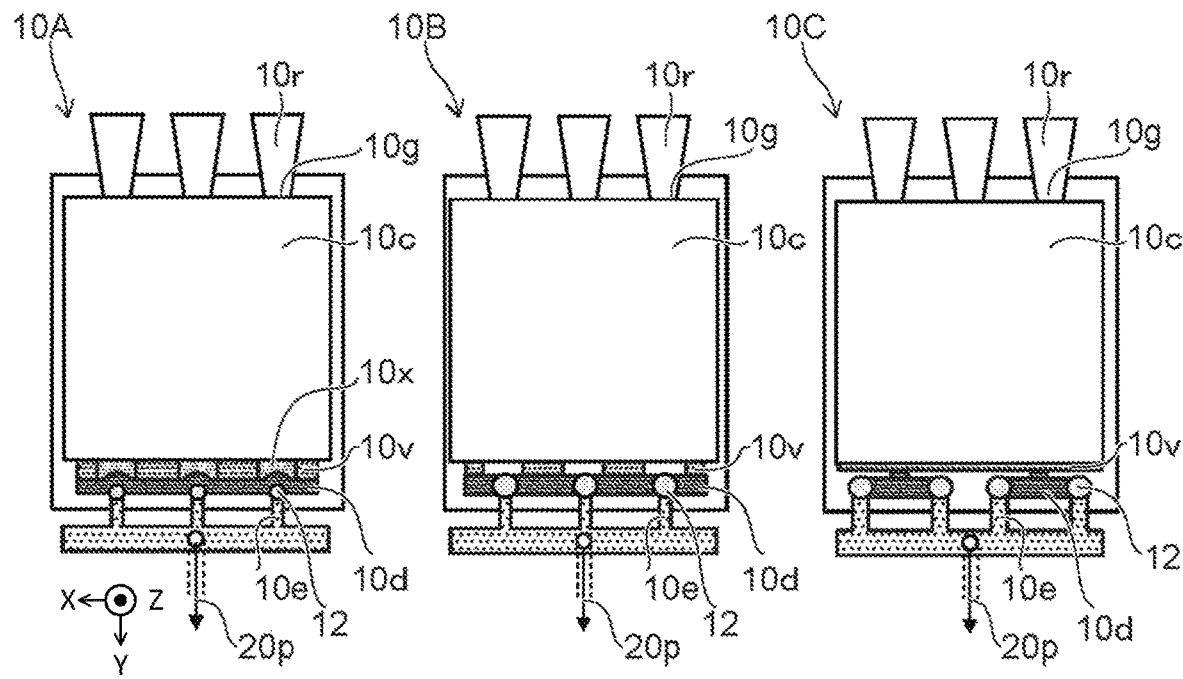
FIG. 9A to FIG. 9F are schematic plan views illustrating the mold according to the embodiment.

As shown in FIG. 9A, the runner 10r, the gate 10g, the cavity 10c, the vent 10v, the intermediate cavity 10d, the suction part 10e, and the opening/closing part 12 (e.g., the shut-off pin, etc.) are provided in a first mold 10A. An intermediate vent 10x is provided in the example. The depth (the depth from the substrate clamping surface 11) of the intermediate vent 10x is shallower than the vent depth Dv of the vent 10v. The intermediate vent 10x is provided between the cavity 10c and the intermediate cavity 10d. The intermediate vents 10x are arranged with the vents 10v in a direction crossing the direction from the cavity 10c toward the intermediate cavity 10d. In the example, the vents 10v and the intermediate vents 10x are connected in parallel. The cavity 10c and the intermediate cavity 10d are connected by these vents that are connected in parallel. By using the multiple vents having different depths, for example, the adjustment of the dam effect of the resin 40 and the exhaust effect is easy.

In a first mold 10B as shown in FIG. 9B, the diameter of the opening/closing part 12 (e.g., the shut-off pin) is substantially the same as the width of the intermediate cavity 10d. Thereby, for example, a higher dam effect of the resin 40 is obtained because the intermediate cavity 10d is dammed and the suction part 10e is dammed.

In a first mold 10C as shown in FIG. 9C, the vent 10v extends along a side of the cavity 10c and is provided to have a long length. Thereby, for example, the damming of the resin 40 is uniform in the plane (the X-Y plane); and the outflow of the resin 40 from the cavity 10c can be uniform in the plane.

Figures 9D, 9E, 9F:
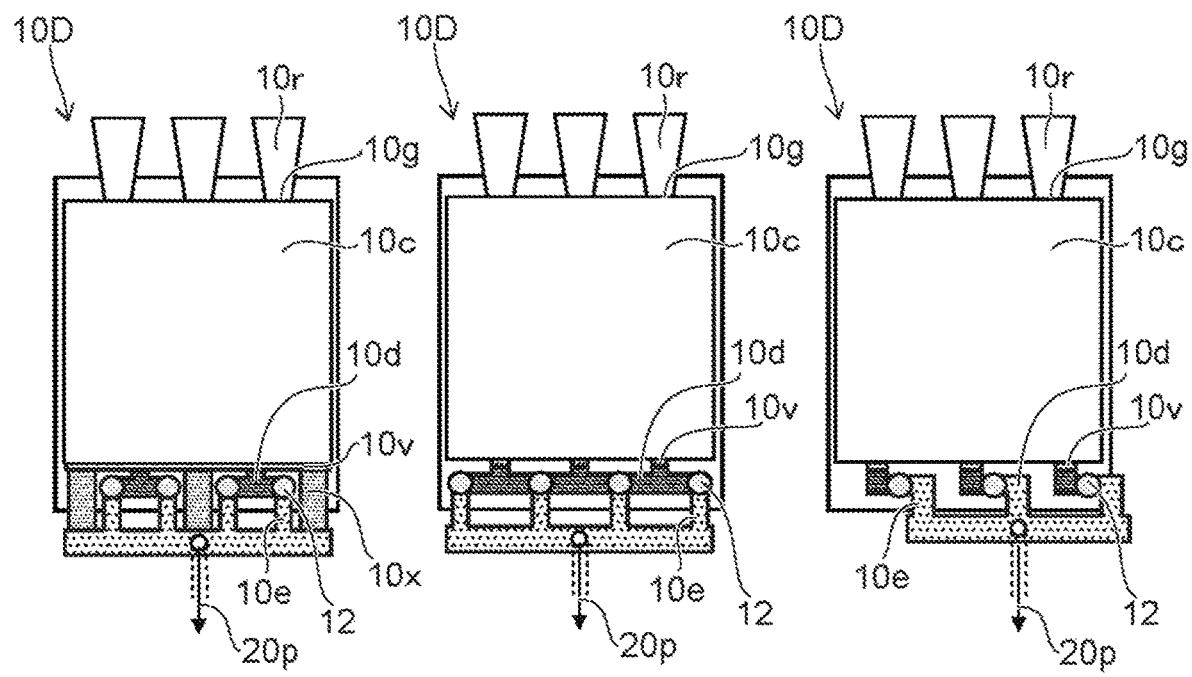

In a first mold 10D as shown in FIG. 9D, the intermediate vent 10x communicates with the suction part 10e without going through the intermediate cavity 10d. Thereby, for example, in addition to the adjustments of the dam effect of the resin 40 and the exhaust effect being easy, the exhaust effect can be sustained even after the opening/closing part 12 is set to the closed state.

In a first mold 10E as shown in FIG. 9E, the intermediate cavity 10d is provided along a side of the cavity 10c to have a long length. The multiple vents 10v that have narrow widths are provided between the cavity 10c and a portion of the intermediate cavity 10d. In this configuration, for example, a higher dam effect of the resin 40 is obtained.

In a first mold 10F as shown in FIG. 9F, one vent 10v is provided for each of the multiple intermediate cavities 10d. In this configuration, for example, the open/close states of the multiple opening/closing parts 12 can be controlled independently according to the difference between the flows of the resin at the multiple intermediate cavities 10d.

Thus, in the embodiment, various modifications are possible for the configurations of the vent 10v and the intermediate cavity 10d.

The embodiment includes a transfer molding method. This method includes introducing the resin 40 to the cavity 10c of the mold 10M (the first mold 10). The mold 10M (the first mold 10) includes: the substrate clamping surface 11 that contacts the surface 71a of the processing substrate 71; the cavity 10c that is recessed from the substrate clamping surface 11; the suction part 10e that is recessed from the substrate clamping surface 11; the vent 10v that is provided on the path 10p between the cavity 10c and the suction part 10e, provided to communicate with the cavity 10c, recessed from the substrate clamping surface 11 to the vent depth Dv, and used as the exhaust path of the gas inside the cavity 10c; the intermediate cavity 10d that is provided between the vent 10v and the suction part 10e on the path 10p, provided to communicate with the vent 10v, and recessed from the substrate clamping surface 11 to the intermediate cavity depth Dd that is deeper than the vent depth Dv; and the opening/closing part 12 that is provided between the intermediate cavity 10d and the suction part 10e on the path 10p and opens and closes the path 10p.

The method according to the embodiment sets the opening/closing part 12 to the closed state after at least a portion of the resin 40 passes through the vent 10v and reaches at least a portion of the intermediate cavity 10d. A transfer molding method that has good moldability can be provided.

For example, to reduce the cost, it may be considered to eliminate the under-fill resin filled into the gaps between the chip stacks including TSV (thru-silicon via), and to perform collective filling using the mold resin. For example, there is a method in which the resin is filled while depressurizing the interior of the cavities of the mold and by operating the shut-off pin directly before the filling completion. However, in the case where the viscosity of the resin is reduced to fill the narrow gaps, even when using such a method, resin leakage or unfilled portions occur easily. In the embodiment, by providing the portion (the vent 10v) that dams the resin in front of the shut-off pin, the operation of the shut-off pin can be delayed. Also, by providing the deep intermediate cavity 10d between the vent 10v and the shut-off pin, the margin of the timing of the operation of the shut-off pin can be widened.

According to the embodiments, a mold and a transfer molding apparatus that have good moldability can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in molds such as cavities, vents, intermediate cavities, suction parts, substrate clamping parts, opening/closing parts, and included in transfer molding apparatus such as transfer parts, sensors, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all molds and transfer molding apparatuses practicable by an appropriate design modification by one skilled in the art based on the molds and transfer molding apparatuses described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A transfer molding apparatus, comprising:
    a mold;
    a transfer part introducing a resin to the mold, and the transfer part configured to be movable between an initial position and a post-movement position; and
    a sensor,
    the mold including
        a substrate clamping surface contacting a surface of a processing substrate;
        a cavity recessed from the substrate clamping surface;
        a suction part recessed from the substrate clamping surface;
        a vent being provided on a path between the cavity and the suction part, communicating with the cavity, being recessed from the substrate clamping surface to a vent depth, and being used as an exhaust path of a gas inside the cavity;
        an intermediate cavity being provided between the vent and the suction part on the path, communicating with the vent, and being recessed from the substrate clamping surface to an intermediate cavity depth deeper than the vent depth; and
        an shut-off pin opening and closing the path and being provided between the intermediate cavity and the suction part on the path,
    the transfer part filling the resin into the cavity in an open state of the shut-off pin,
    the sensor positioned between an input of the vent and the intermediate cavity and sensing that at least a portion of the resin has passed through the vent and reached at least a portion of the intermediate cavity,
    the shut-off pin being set to a closed state after the sensing by the sensor.

2. The apparatus according to claim 1, wherein the sensing by the sensor includes at least one of:
    sensing, at a path between the transfer part and the cavity, at least one of a temperature of the mold, a pressure of the resin, reflected light at the mold, or reflected light at the processing substrate;
    sensing, at the path between the cavity and the suction part, at least one of a temperature of the mold, a pressure of the resin, reflected light at the mold, or reflected light at the processing substrate; or
    sensing a position of the transfer part.

3. The apparatus according to claim 1, wherein the sensing by the sensor includes
    sensing, at a path between the transfer part and the cavity, at least one of a temperature of the mold, a pressure of the resin, reflected light at the mold, or reflected light at the processing substrate.

4. The apparatus according to claim 1, wherein the sensing by the sensor includes
    sensing, at the path between the cavity and the suction part, at least one of a temperature of the mold, a pressure of the resin, reflected light at the mold, or reflected light at the processing substrate.

5. The apparatus according to claim 1, wherein the sensing by the sensor includes
    sensing a position of the transfer part.

6. The apparatus according to claim 1, comprising:
    at least two intermediate cavities,
    the shut-off pin including multiple shut-off pins, a first shut-off pin positioned at a first position and a second shut-off pin positioned at a second position,
    the first position being provided between one of the intermediate cavities and the suction part on the path,
    the second position being provided between another of the intermediate cavities and the suction part on the path,
    the sensor sensing that at least a portion of the resin has reached at least a portion of the one of the intermediate cavities or the another of the intermediate cavities,
    the first position or the second position being set to a closed state after the sensing by the sensor.

7. The apparatus according to claim 1, wherein
    the mold including a gate being recessed from the substrate clamping surface to a gate depth,
    the cavity being provided at least a part between the vent and the gate,
    the vent depth being shallower than the gate depth.

* * * * *